(12) United States Patent
Tanzawa et al.

(10) Patent No.: US 7,154,729 B2
(45) Date of Patent: Dec. 26, 2006

(54) SOLENOID DRIVE APPARATUS

(75) Inventors: Takanao Tanzawa, Odawara (JP); Shigeru Yamazaki, Odawara (JP); Osamu Miura, Odawara (JP); Kunihiko Hayakawa, Odawara (JP); Hirokazu Hirosawa, Odawara (JP)

(73) Assignee: Mikuni Corporation, Tokyo (JP)

( * ) Notice: Subject to any disclaimer, the term of this patent is extended or adjusted under 35 U.S.C. 154(b) by 76 days.

(21) Appl. No.: 10/485,216

(22) PCT Filed: Aug. 1, 2002

(86) PCT No.: PCT/JP02/07848

§ 371 (c)(1),
(2), (4) Date: Jan. 29, 2004

(87) PCT Pub. No.: WO03/014556

PCT Pub. Date: Feb. 20, 2003

(65) Prior Publication Data
US 2004/0212944 A1    Oct. 28, 2004

(30) Foreign Application Priority Data
Aug. 2, 2001    (JP) .............................. 2001-235621

(51) Int. Cl.
H01H 47/00    (2006.01)
H01H 47/32    (2006.01)
(52) U.S. Cl. ...................................................... 361/156
(58) Field of Classification Search ................. 361/156
See application file for complete search history.

(56) References Cited

U.S. PATENT DOCUMENTS 3,708,726 A * 1/1973 Puvogel ...................... 361/156
4,563,995 A * 1/1986 Locher et al. .............. 123/494
5,303,138 A * 4/1994 Rozman .................. 363/21.06
5,717,562 A * 2/1998 Antone et al. .............. 361/155
5,796,223 A   8/1998 Ohtsuka et al.
5,938,172 A * 8/1999 Ohtsuka et al. ........ 251/129.01
6,031,702 A * 2/2000 Williams ...................... 361/87
6,123,058 A * 9/2000 Endou ......................... 123/490
6,209,513 B1 * 4/2001 Sakasai et al. ............... 123/299

FOREIGN PATENT DOCUMENTS

JP    8-14091    1/1996

(Continued)

Primary Examiner—Stephen W. Jackson
Assistant Examiner—Ann T. Hoang
(74) Attorney, Agent, or Firm—Wenderoth, Lind & Ponack, L.L.P.

(57) ABSTRACT

In a solenoid driving device of the type in which energy stored in a capacitor is used for re-driving of the solenoid, the generation of heat in a current back-flow preventing circuit preventing the back-flow of current to a power supply terminal is suppressed, and the generation of heat in a rectifying element through which the current that flows to the capacitor passes is suppressed. Electric power accumulated in the solenoid when the driving of the solenoid is stopped is temporarily stored in the capacitor, and a high voltage that is generated by the charging utilizing the peak voltage of the capacitor is utilized as the power supply for a discharge control circuit that controls the discharge of the capacitor. The current back-flow preventing circuit is constructed from a switching element such as an FET so that the generation of heat in this circuit is suppressed. Furthermore, the rectifying element through which the current that flows to the capacitor passes is constructed from a switching element such as an FET so that the generation of heat in this element is suppressed.

5 Claims, 11 Drawing Sheets

FOREIGN PATENT DOCUMENTS

| | | |
|---|---|---|
| JP | 11-315745 | 11/1999 |
| JP | 2000-28027 | 1/2000 |
| JP | 2001-12285 | 1/2001 |
| JP | 2001-15332 | 1/2001 |

* cited by examiner

SOLENOID DRIVE APPARATUS

BACKGROUND OF THE INVENTION

1. Field of the Invention

The present invention relates to a solenoid for fuel injection, which is used in an electronically controlled fuel injection device that supplies fuel to an engine or the like. More particularly, the present invention relates to a solenoid driving device using a system in which the electric power that is accumulated in the solenoid when the driving of the solenoid is stopped is temporarily stored in a capacitor, and the electric power that is stored in this capacitor is supplied to the solenoid when the solenoid is again driven.

2. Description of the Related Art

FIG. 8 is a block diagram which shows the construction of a common solenoid driving device. This solenoid driving device is constructed from a solenoid 11, a solenoid driving element 12 which is used to drive the solenoid 11, a solenoid driving element control circuit 13 which controls the on/off switching of the solenoid driving element 12 on the basis of control signals that are input from the outside (i.e., externally supplied), and a snubber circuit 14 that is used to consume the electric power that is accumulated in the solenoid 11 when the driving of the solenoid 11 is stopped. In FIG. 8, reference numeral 15 indicates a power supply terminal to which a power supply voltage (battery voltage) VB is applied, and reference numeral 16 indicates a control signal input terminal.

In the case of the solenoid driving device constructed as shown in FIG. 8, when the solenoid driving element 12 is in an "on" state, current flows through the solenoid 11, and fuel is injected after a fixed period of time. After a fixed period of time has elapsed in this state, the solenoid driving element 12 is switched to an "off" state in order to stop the injection of fuel. At this time, the current that had been flowing to the solenoid 11 flows to the snubber circuit 14, and the electric power is consumed by this snubber circuit 14. As a result, the electric current that flows to the solenoid 11 is gradually reduced, and eventually reaches zero so that the injection of fuel is stopped.

FIG. 9 is a circuit diagram which shows the concrete construction of the solenoid driving device shown in FIG. 8. The solenoid driving element 12 is constructed from an N-channel field effect transistor (hereafter referred to as an "FET") 121. The solenoid driving element control circuit 13 is constructed from an npn transistor 131 and four resistors 132, 133, 134 and 135. The snubber circuit 14 is constructed from a Zener diode 141.

One end of the solenoid 11 is connected to the power supply terminal 15, and the other end of the solenoid 11 is connected to the drain terminal of the FET 121 and the cathode terminal of the Zener diode 141. The source terminal of the FET 121 and the anode terminal of the Zener diode 141 are grounded. The collector terminal of the npn transistor 131 is connected to the gate terminal of the FET 121. The first resistor 132 is connected between the collector terminal of the npn transistor 131 and the power supply terminal 15. The base terminal of the npn transistor 131 is connected to the control signal input terminal 16 via the second resistor 133. The control signal input terminal 16 is pulled up to the power supply voltage Vcc by the third resistor 134. The emitter terminal of the npn transistor 131 is connected to the base terminal via the fourth resistor 135, and is grounded.

FIG. 10 is a circuit diagram which shows another example of the concrete construction of the solenoid driving device shown in FIG. 8. In the solenoid driving device shown in FIG. 10, the anode terminal of the Zener diode 141 in the device shown in FIG. 9 is connected to the collector terminal of the npn transistor 131 via a fifth resistor 136 instead of being grounded, and a diode 142 is connected between the cathode terminal of the Zener diode 141 and the solenoid 11 so that the diode 142 is oriented in the direction in which current flows from the solenoid 11 to the Zener diode 141.

However, in the case of the solenoid driving devices constructed as shown in FIGS. 8 through 10, when the capacity of the solenoid 11 is increased, the electric power that is consumed by the snubber circuit 14 is considerably increased, and as a result, the generation of heat becomes a problem. Accordingly, for the purpose of reducing this generation of heat and achieving effective utilization of the electric power and an increased driving speed, a solenoid device is universally known with a construction in which the energy that accumulates when the coil current that flows to the solenoid is stopped is temporarily stored in a capacitor, and the coil current is abruptly increased by utilizing the energy stored in the capacitor when the coil current is again caused to flow to the solenoid.

FIG. 11 is a block diagram which shows the construction of a conventional solenoid driving device of the type in which energy stored in a capacitor is utilized in the re-driving of the solenoid. This solenoid driving device is constructed from a solenoid 11, a solenoid driving element 12, a solenoid driving element control circuit 13, a capacitor 21 that temporarily stores the energy that accumulates when the driving of the solenoid 11 is stopped, a discharge control element 22 that controls the discharge of the capacitor 21, a discharge control circuit 23 that controls the on/off switching of the discharge control element 22, a DC—DC converter circuit 24 that raises the power supply voltage VB and supplies a high voltage to the discharge control circuit 23, a current back-flow preventing circuit 25 that prevents the voltage from entering the power supply side when a high voltage stored in the capacitor 21 is applied to the solenoid 11, and a rectifying element 26 that prevents a direct current from flowing into the solenoid driving element 12 from the capacitor 21 as a result of the high voltage stored in the capacitor 21. Furthermore, constructions that are the same as in the apparatus shown in FIG. 8 are labeled with the same symbols, and a description thereof is omitted.

Next, the operation of the solenoid driving device constructed as shown in FIG. 11 will be described. First, when the solenoid driving element 12 is switched from an "off" state to an "on" state by the control of the solenoid driving element control circuit 13, a current begins to flow to the solenoid 11 from the power supply terminal 15 via the current back-flow preventing circuit 25. Then, after a fixed period of time has elapsed, fuel injection is initiated. After another fixed period of time has elapsed, the solenoid driving element 12 is switched to an "off" state in order to stop the injection of fuel. At this time, the current that had been flowing to the solenoid 11 flows to the capacitor 21 via the rectifying element 26. The voltage VC of the capacitor 21 rises at the same time that current flows in, so that the electric power that had accumulated in the solenoid 11 is absorbed by the capacitor 21. The rise of the voltage VC of the capacitor 21 stops at the same time that the current flowing into the capacitor 21 reaches zero.

When fuel injection is again performed following this state, the solenoid driving element 12 is switched to an "on" state, and at the same time, the discharge control element 22 is switched to an "on" state. As a result, the voltage VSH on the high-potential side of the solenoid 11 becomes the same as the voltage VC generated by the charging of the capacitor 21, and becomes higher than the power supply voltage VB. Accordingly, a current abruptly begins to flow to the solenoid 11. Since this current flows out from the capacitor 21, the voltage VC of the capacitor 21, i.e., the voltage VSH on the high-potential side of the solenoid 11, drops. Then, at the point in time at which the voltage VSH on the high-potential side of the solenoid 11 becomes lower than the power supply voltage VB, the current that flows out of the capacitor 21 becomes zero, and a current begins to flow to the solenoid 11 from the power supply voltage VB. In this case, the current that flows to the solenoid 11 continues to increase to the voltage that is limited by the winding resistance of the solenoid 11.

Thus, excluding the initial fuel injection, the current that flows to the solenoid 11 is abruptly increased by the voltage that is generated by the charging of the capacitor 21 during the second and subsequent fuel injections. During this abrupt increase, the current that flows from the power supply terminal 15 is zero. Accordingly, the amount of current that flows from the power supply terminal 15 is decreased overall, so that the power consumption is reduced. Furthermore, the current that flows through the solenoid 11 abruptly rises to a value that is close to the required current, so that the response is improved.

However, in the abovementioned conventional solenoid driving device of the type in which energy stored in capacitor is utilized for re-driving of the solenoid, as is shown in FIG. 11, a DC—DC converter circuit 24, which is used to supply a high voltage to the discharge control circuit 23, is necessary, resulting in the problem of an increased complexity of the circuit and an increased size of the circuit. Furthermore, since the current back-flow preventing circuit 25 is ordinarily constructed from a diode, the following problem also arises: namely, when a large power supply current flows through this circuit, the amount of heat generated is increased as a result of the voltage drop of approximately 0.7 V of the diode. Furthermore, since the rectifying element 26 between the solenoid driving element 12 and the capacitor 21 is also constructed from a diode, the generation of heat caused by the current that flows through this diode is also a problem.

SUMMARY OF THE INVENTION

The present invention was devised in light of the above-mentioned problems. It is therefore an object of the present invention to provide a solenoid driving device of the type in which energy stored in a capacitor is used for re-driving of the solenoid, wherein a DC—DC converter circuit is unnecessary, and wherein the generation of heat in the current back-flow preventing circuit that prevents the back-flow of current to the power supply terminal can be suppressed, and the generation of heat in the rectifying element through which the current that flows to the capacitor passes can be suppressed.

In order to achieve the above-mentioned object, the solenoid driving device of the present invention is devised so that the electric power that is accumulated in the solenoid when the driving of the solenoid is stopped is temporarily stored in a capacitor, and the high voltage that is generated by the charging utilizing the peak voltage of the capacitor is utilized as the power supply of the discharge control circuit that is used to control the discharge of the capacitor. In the present invention, the discharge control circuit is driven by the high voltage that is generated in the capacitor.

Furthermore, in the solenoid driving device of the present invention, the current back-flow preventing circuit is constructed from a switching element such as an FET or the like. In the present invention, the voltage drop that occurs in the current back-flow preventing circuit when current flows from the power supply terminal to the solenoid is reduced, so that the generation of heat in this circuit is suppressed.

Furthermore, in the solenoid driving device of the present invention, the rectifying element through which the current that flows to the capacitor passes is constructed from a switching element such as an FET or the like. In the present invention, the voltage drop that occurs in the rectifying element when current flows from the solenoid to the capacitor is reduced, so that the generation of heat in this circuit is suppressed.

DETAILED DESCRIPTION OF THE PREFERRED EMBODIMENTS

Solenoid driving devices constituting embodiments of the present invention will be described in detail below with reference to the attached drawings.

First Embodiment

Figure 1:
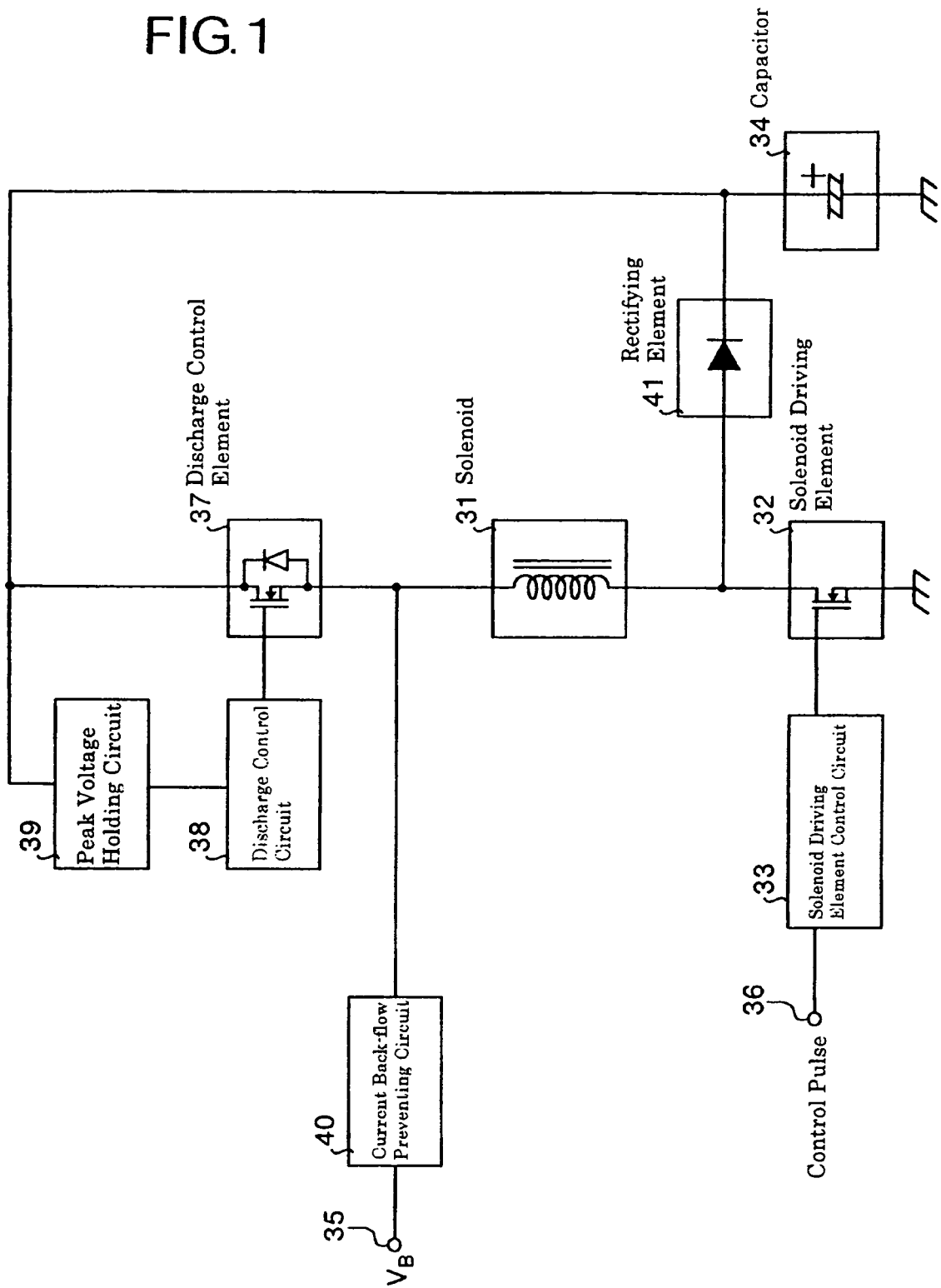
FIG. 1 is a block diagram which shows the construction of a solenoid driving device constituting a first embodiment of the present invention.

FIG. 1 is a block diagram which shows the construction of a solenoid driving device constituting a first embodiment of the present invention. This solenoid driving device is constructed from a solenoid 31, a solenoid driving element 32, a solenoid driving element control circuit 33, a capacitor 34, a power supply terminal 35, a control signal input terminal 36, a discharge control element 37, a discharge control circuit 38, a peak voltage holding circuit 39, a current back-flow preventing circuit 40, and a rectifying element 41.

Figure 11:
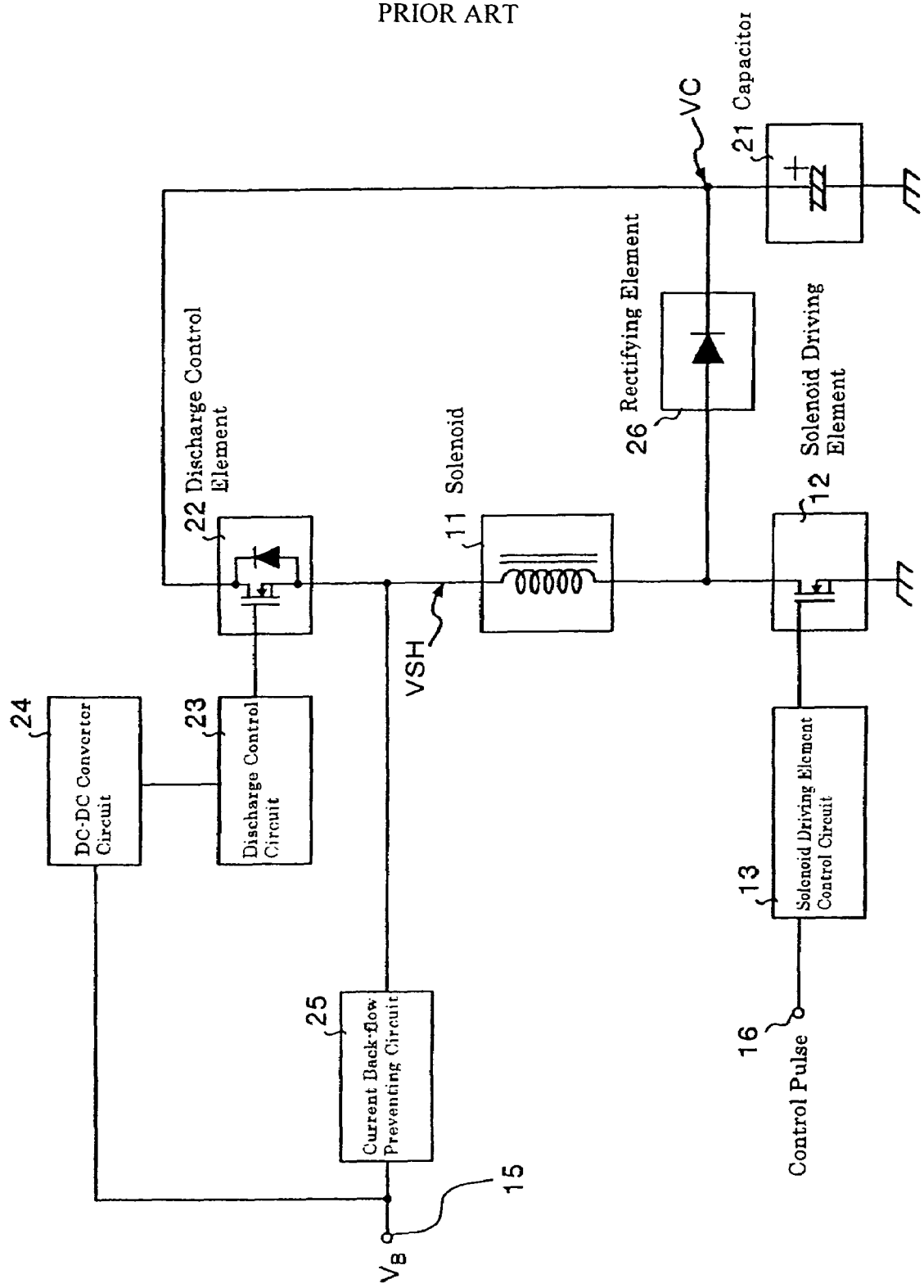
FIG. 11 is a block diagram which shows the construction of a conventional solenoid driving device of the type in which re-driving of the solenoid is performed by utilizing energy stored in a capacitor.

The peak voltage holding circuit 39 holds the peak voltage generated by the charging of the capacitor 34, and supplies this voltage to the discharge control circuit 38. Except for the peak voltage holding circuit 39, the construction of this solenoid driving device constituting the first embodiment is the same as that of the conventional solenoid driving device shown in FIG. 11. Furthermore, the operation of this solenoid driving device during the driving of the solenoid 31 and during the period when this driving is stopped is the same as that of the conventional solenoid driving device shown in FIG. 11.

Figure 2:
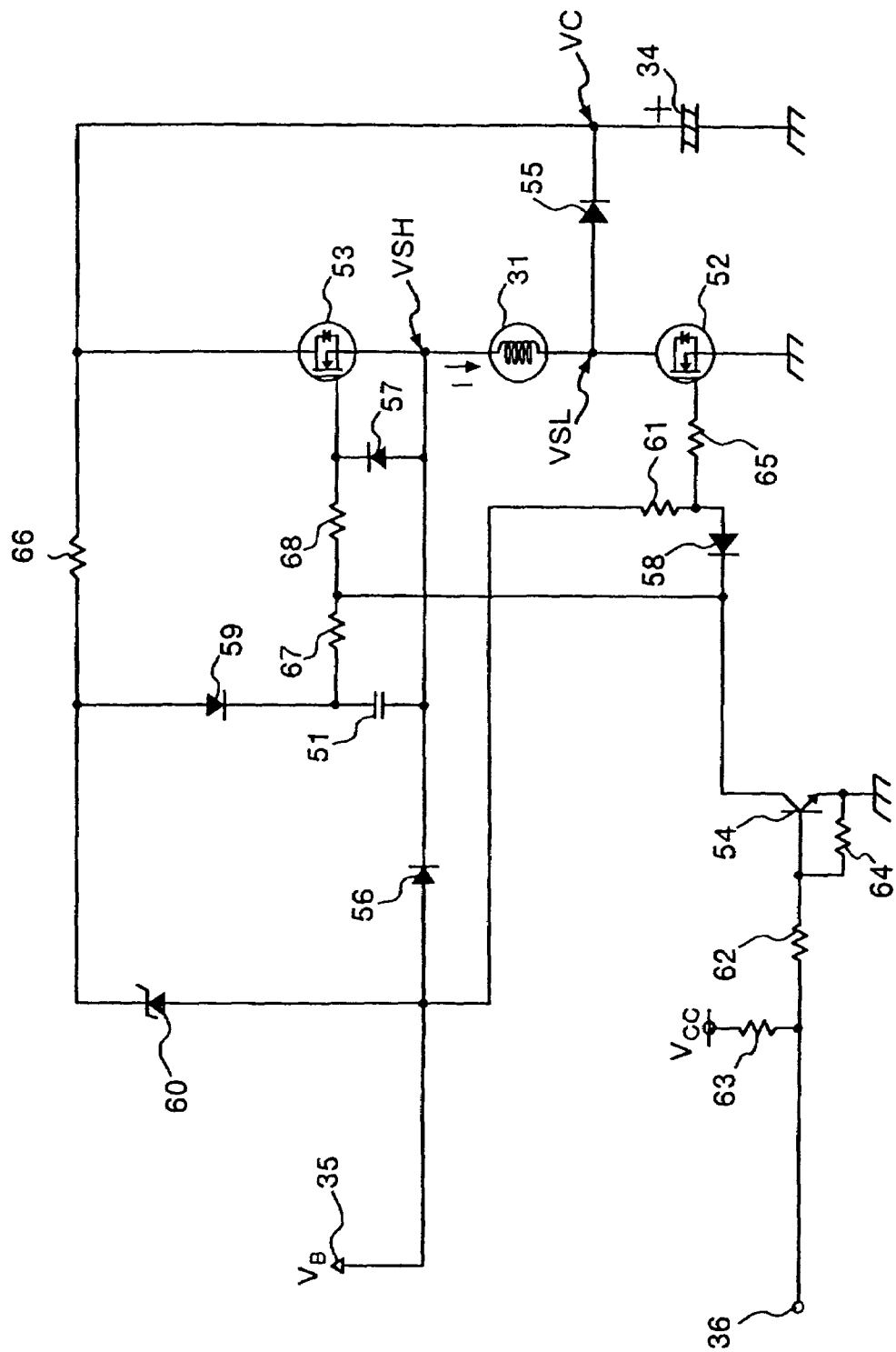
FIG. 2 is a circuit diagram which shows one example of the construction of the solenoid driving device constituting the first embodiment of the present invention.

FIG. 2 is a circuit diagram which shows an example of the construction of the solenoid driving device of the first embodiment of the present invention. This solenoid driving device comprises a solenoid 31, two capacitors 34 and 51, two N-channel FETs 52 and 53, an npn transistor 54, five diodes 55, 56, 57, 58 and 59, a Zener diode 60, eight resistors 61, 62, 63, 64, 65, 66, 67 and 68, a power supply terminal 35, and a control signal input terminal 36. The first N-channel FET 52 forms the solenoid driving element 32. The second N-channel FET 53 forms the discharge control element 37. The first diode 55 forms the rectifying element 41. The second diode 56 forms the current back-flow preventing circuit 40.

The anode terminal of the second diode 56 is connected to the power supply terminal 35. The cathode terminal of the second diode 56 is connected to one end of the solenoid 31. The other end of the solenoid 31 is connected to the drain terminal of the first N-channel FET 52 and the anode terminal of the first diode 55. The source terminal of the first N-channel FET 52 is grounded. The cathode terminal of the first diode 55 is connected to the positive pole terminal of the first capacitor 34. The negative pole terminal of the first capacitor 34 is grounded. Furthermore, the positive pole terminal of the first capacitor 34 is connected to the drain terminal of the second N-channel FET 53. The source terminal of the second N-channel FET 53 is connected to one end of the solenoid 31 on the side of the solenoid 31 that is connected to the power supply terminal 35 via the second diode 56.

Furthermore, the anode terminal of the third diode 58 is connected to the power supply terminal 35 via the first resistor 61. The cathode terminal of the third diode 58 is connected to the collector terminal of the npn transistor 54. The emitter terminal of the npn transistor 54 is grounded. The base terminal of the npn transistor 54 is connected to the control signal input terminal 36 via the second resistor 62. The control signal input terminal 36 is pulled up to the power supply voltage Vcc by the third resistor 63. The fourth resistor 64 is connected between the base terminal and the emitter terminal of the npn transistor 54. The base terminal of the first N-channel FET 52 is connected to the connecting node of the first resistor 61 and the third diode 58 via the fifth resistor 65. The npn transistor 54, first through fifth resistors 61, 62, 63, 64 and 65 and third diode 58 constitute the solenoid driving element control circuit 33.

Furthermore, the anode terminal of the Zener diode 60 is connected to the power supply terminal 35. The cathode terminal of the Zener diode 60 is connected to the positive pole terminal of the first capacitor 34 via the sixth resistor 66, and is also connected to the anode terminal of the fourth diode 59. The second capacitor 51 is connected between the cathode terminal of the fourth diode 59 and the cathode terminal of the second diode 56. The Zener diode 60, sixth resistor 66, fourth diode 59 and second capacitor 51 constitute the peak voltage holding circuit 39.

The seventh resistor 67 and the eighth resistor 68 are connected in series between the gate terminal of the second N-channel FET 53 and the connecting node of the fourth diode 59 and the second capacitor 51. The connecting node of the seventh resistor 67 and the eighth resistor 68 is connected to the collector terminal of the npn transistor 54. The anode terminal of the fifth diode 57 is connected to the source terminal of the second N-channel FET 53, and the cathode terminal of the fifth diode 57 is connected to the gate terminal of the second N-channel FET 53. The npn transistor 54, second through fourth resistors 62, 63 and 64, seventh and eighth resistors 67 and 68 and fifth diode 57 constitute the discharge control circuit 38.

Characteristic values of the respective elements will be shown as examples. For example, the respective capacitance values of the first capacitor 34 and second capacitor 51 are 100 μF and 0.1 μF. The output voltage of the Zener diode 60 is (for example) 9 V. The resistance value of the first resistor 61 is (for example) 3.3 kΩ. The resistance value of the second resistor 62 is (for example) 4.7 kΩ. The resistance values of the third resistor 63, sixth resistor 66 and seventh resistor 67 are (for example) 10 kΩ. The resistance value of the fourth resistor 64 is (for example) 47 kΩ. The resistance value of the fifth resistor 65 is (for example) 1 kΩ. The resistance value of the eighth resistor 68 is (for example) 2 kΩ.

Figure 3:
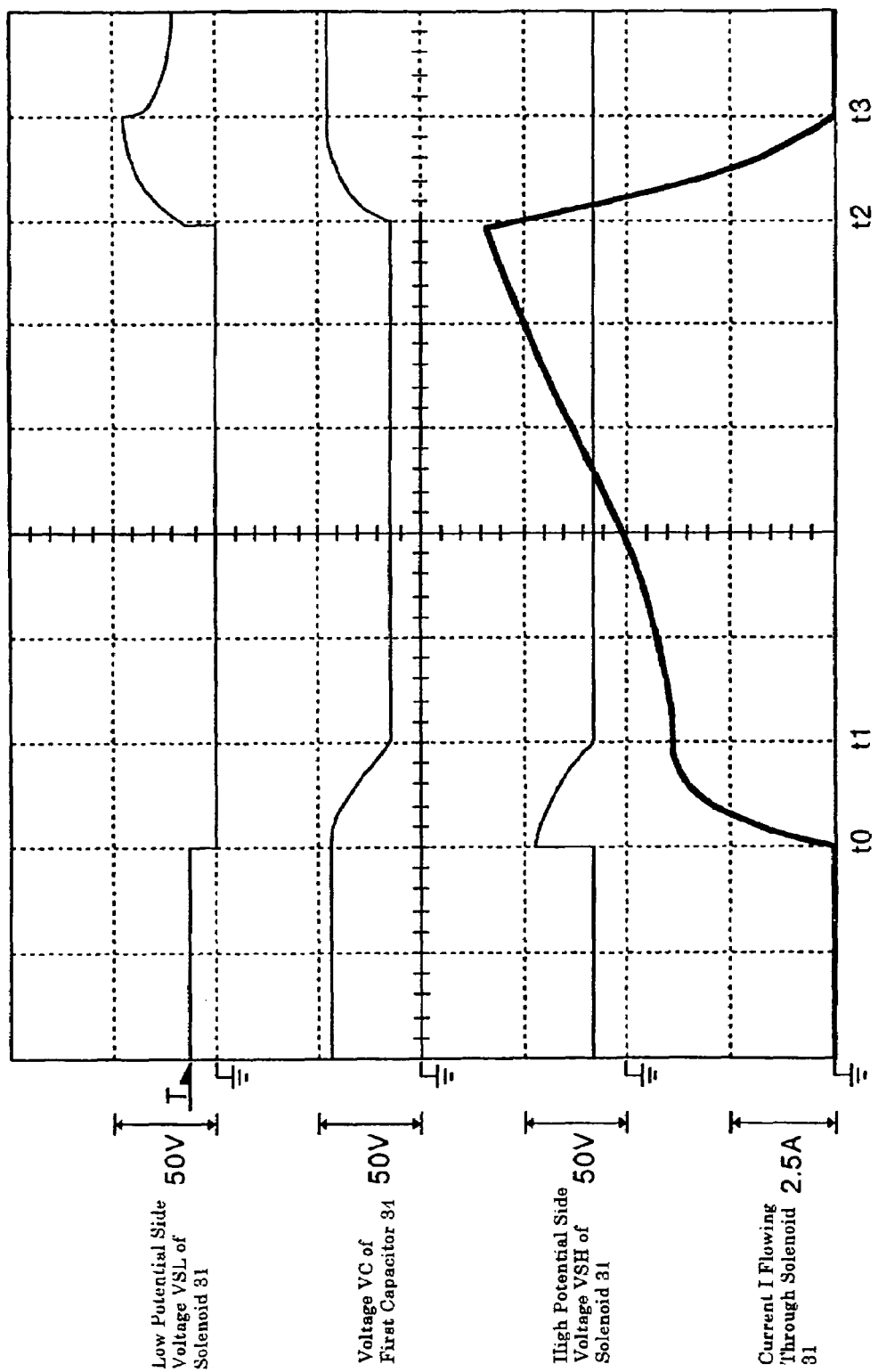
FIG. 3 is a waveform diagram which shows examples of the waveforms in various parts of the solenoid driving device constituting the first embodiment of the present invention.

The operation of the solenoid driving device constructed as shown in FIG. 2 will be described with reference to FIG. 3. FIG. 3 is a diagram which shows the respective waveforms of the voltage VSL on the low-potential side of the solenoid 31, the voltage VC of the first capacitor 34, the voltage VSH on the high-potential side of the solenoid 31, and the current I that flows through the solenoid 31.

First, when the npn transistor 54 is switched from an "on" state to an "off" state on the basis of a control signal input from the control signal input terminal 36, the first N-channel FET 52 is switched from an "off" state to an "on" state, so that a current begins to flow to the solenoid 31 from the power supply terminal 35 via the second diode 56. Then, after a fixed period of time has elapsed, fuel injection is initiated. In this case, since the second capacitor 51 is not charged, the second N-channel FET 53 remains in an "off" state.

After a fixed period of time has elapsed, the npn transistor 54 is switched from an "off" state to an "on" state, and the first N-channel FET 52 is switched to an "off" state. In this case, the current that had been flowing to the solenoid 31 flows to the first capacitor 34 via the first diode 55. As a result, the voltage VC of the first capacitor 34 rises, and the electric power accumulated in the solenoid 31 is absorbed by the first capacitor 34. When the current flowing into the first capacitor 34 reaches zero, the rise of the voltage VC of the first capacitor 34 simultaneously stops. The second capacitor 51 is also charged along with the charging of this first capacitor 34. At this point in time, since no current flows to the solenoid 31, the injection of fuel is stopped.

When fuel injection is again performed following this state, the npn transistor 54 is switched from an "on" state to an "off" state, and the first N-channel FET 52 is switched to an "on" state (time t0 in FIG. 3). In this case, since second capacitor 51 is charged, the gate potential of the second N-channel FET 53 is at the H level; accordingly, the second N-channel FET 53 is also simultaneously switched to an "on" state. As a result, the voltage VSH on the high-potential side of the solenoid 31 becomes the same as the voltage VC of the first capacitor 34, and thus exceeds the power supply voltage VB that is applied to the power supply terminal 35. Accordingly, a current abruptly begins to flow to the solenoid 31 from the first capacitor 34. As a result of the flow of this current, the voltage VC of the first capacitor 34, i.e., the voltage VSH on the high-potential side of the solenoid 31, drops.

Then, at the point in time where the voltage VSH on the high-potential side of the solenoid 31 drops below the power supply voltage VB (time t1 in FIG. 3), the current that flows out of the first capacitor 34 becomes zero, and a current instead begins to flow to the solenoid 31 from the power supply terminal 35 via the second diode 56. The current that flows to the solenoid 31 in this case continues to increase to a voltage that is limited by the winding resistance of the solenoid 31. Fuel injection continues to be performed while a current flows to the solenoid 31.

After a fixed time has elapsed in this state, the npn transistor 54 is switched from an "off" state to an "on" state. As a result, the first N-channel FET 52 is switched to an "off" state (time t2 in FIG. 3), and the current that had been flowing to the solenoid 31 flows to the first capacitor 34 as described above, so that the electric power accumulated in the solenoid 31 is stored in the first capacitor 34. In this case, the second capacitor 51 is also charged. Then, when the current that flows into the first capacitor 34 reaches zero (time t3 in FIG. 3), the injection of fuel stops. When fuel injection is again performed, the electric power stored in the first capacitor 34 is supplied to the solenoid 31 as described above, and this is repeated.

In the above-mentioned first embodiment, when the driving of the solenoid 31 is stopped, the first capacitor 34 is charged by the current that had been flowing to the solenoid 31. As a result, the second capacitor 51 of the peak voltage holding circuit 39 is charged, and the second N-channel FET 53 of the discharge control element 37 is driven by the voltage that is generated by this charging of the second capacitor 51. Accordingly, there is no need for a DC—DC converter circuit, whereby the circuit can be simplified, and the size of the circuit can be reduced. Furthermore, a high-performance N-channel FET (second N-channel FET 53), which is less expensive than a P-channel FET, can be used as the discharge control element 37.

Second Embodiment

Figure 4:
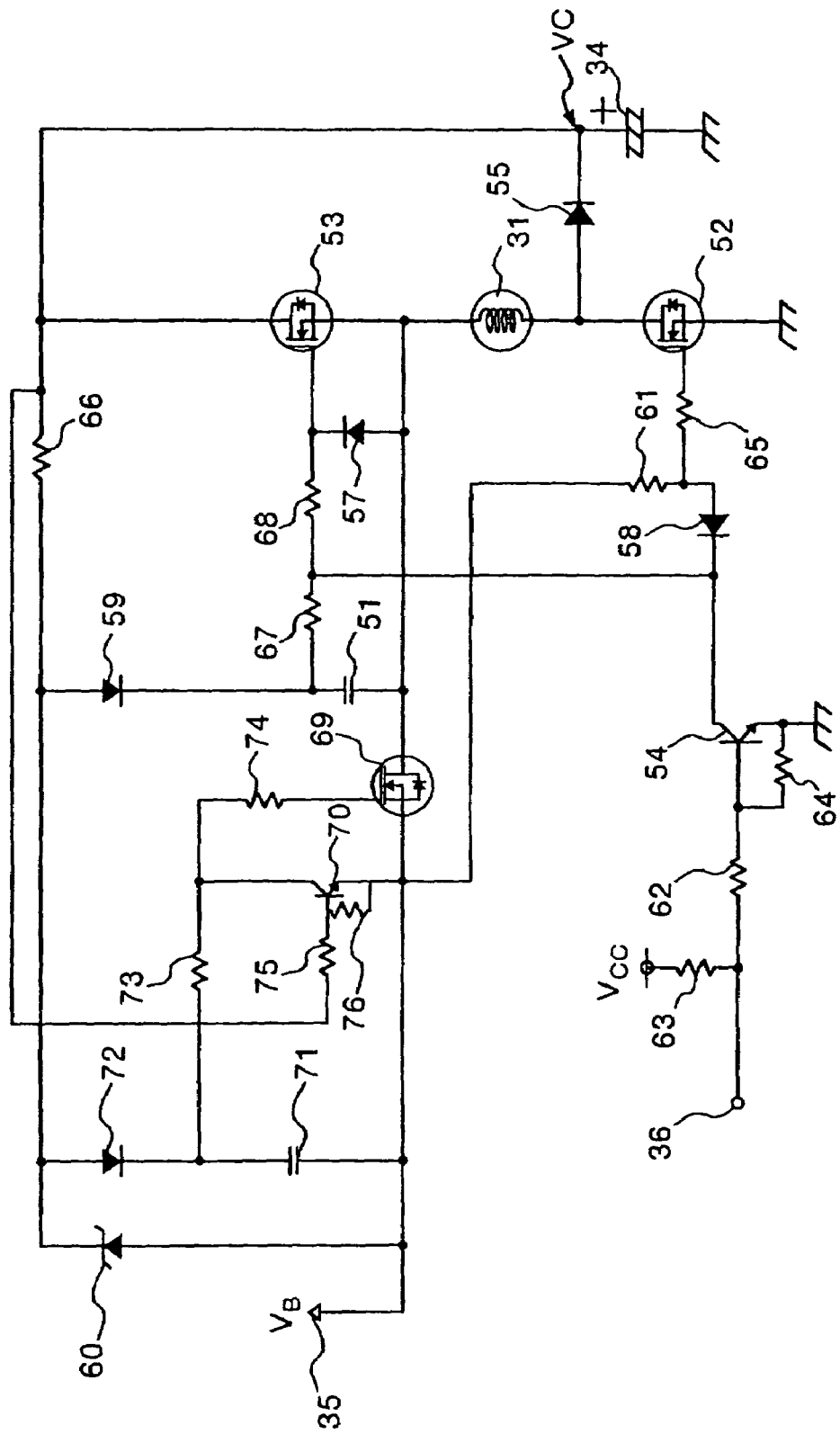
FIG. 4 is a circuit diagram which shows one example of the construction of a solenoid driving device constituting a second embodiment of the present invention.

FIG. 4 is a circuit diagram which shows one example of the construction of a solenoid driving device constituting a second embodiment of the present invention. The solenoid driving device of the second embodiment differs from the first embodiment shown in FIG. 2 in that a switching element is installed as the current back-flow preventing circuit instead of the second diode 56 that constitutes the current back-flow preventing circuit 40 of the first embodiment. There are no particular restrictions on this switching element; for example, however, this switching element is constructed from an N-channel FET (hereafter referred to as the "third N-channel FET") 69.

Furthermore, in the second embodiment, an npn transistor (hereafter referred to as the "second npn transistor") 70, a third capacitor 71, a fifth diode 72 and ninth through twelfth resistors 73, 74, 75 and 76 are installed as a switching element control circuit for the purpose of controlling the on/off switching of the third N-channel FET 69. The remaining construction of the second embodiment is the same as that of the first embodiment. Accordingly, the same symbols as in the first embodiment are assigned, and a description thereof is omitted.

The source terminal of the third N-channel FET 69 is connected to the power supply terminal 35. The drain terminal of the third N-channel FET 69 is connected to the connecting node of the solenoid 31 and the second N-channel FET 53. The anode terminal of the fifth diode 72 is connected to the connecting node of the cathode terminal of the Zener diode 60 and the sixth resistor 66. The cathode terminal of the fifth diode 72 is connected to the anode terminal of the Zener diode 60 (power supply terminal 35) via the third capacitor 71. The fifth diode 72, third capacitor 71, Zener diode 60 and sixth resistor 66 hold the peak voltage generated by the charging of the first capacitor 34 in order to drive the switching element control circuit.

The connecting node of the fifth diode 72 and the third capacitor 71 is connected to the ninth resistor 73, and this ninth resistor 73 is connected to the base terminal of the third N-channel FET 69 via the tenth resistor 74. The collector terminal of the second npn transistor 70 is connected to the connecting node of the ninth resistor 73 and the tenth resistor 74. The emitter terminal of the second npn transistor 70 is connected to the power supply terminal 35. The base terminal of the second npn transistor 70 is connected to the positive pole terminal of the first capacitor 34 via the eleventh resistor 75. The twelfth resistor 76 is connected between the base terminal and the emitter terminal of the second npn transistor 70.

Characteristic values of the respective elements will be shown as examples. For example, the capacitance of the third capacitor 71 is 0.1 μF. The resistance value of the ninth resistor 73 is (for example) 10 kΩ. The resistance value of the tenth resistor 74 is (for example) 100Ω. The resistance value of the eleventh resistor 75 is (for example) 20 kΩ. The resistance value of the twelfth resistor 76 is (for example) 10 kΩ.

In the solenoid driving device constructed as shown in FIG. 4, the second npn transistor 70 is switched to an "on" state when the voltage VC of the first capacitor 34 is higher than the power supply voltage $V_B$ that is applied to the power supply terminal 35. As a result, the third N-channel FET 69 is switched to an "off" state. Accordingly, the first N-channel FET 52 and the second N-channel FET 53 are both switched to an "on" state, so that when a current abruptly flows to the solenoid 31 from the first capacitor 34, this current is prevented from flowing back toward the power supply terminal 35.

When the voltage VC of the first capacitor 34 falls below the power supply voltage $V_B$, the second npn transistor 70 is switched to an "off" state, and the third N-channel FET 69 is switched to an "on" state. As a result, a current flows to the solenoid 31 from the power supply terminal 35. When the npn transistor 54 of the solenoid driving element control circuit 33 is switched to an "on" state in order to stop the injection of fuel, the second npn transistor 70 is switched to an "on" state, and the third N-channel FET 69 is switched to an "off" state. In this case, the current that flows to the first capacitor 34 from the power supply terminal 35 via the solenoid 31 and the first diode 55 passes through a diode contained in the third N-channel FET 69.

In the above-mentioned second embodiment, since there is no need for a DC—DC converter circuit, an effect which makes it possible to simplify the circuit and reduce the size of the circuit, and an effect which makes it possible to use an N-channel FET (second N-channel FET 53) as the discharge control element 37, are obtained. In addition, since the current back-flow preventing circuit is constructed from a switching element, an effect which makes it possible to suppress the generation of heat caused by the current that flows through this circuit is obtained. Furthermore, a high-performance N-channel FET (third N-channel FET 69) which is less expensive than a P-channel FET can be used as the switching element.

Third Embodiment

Figure 5:
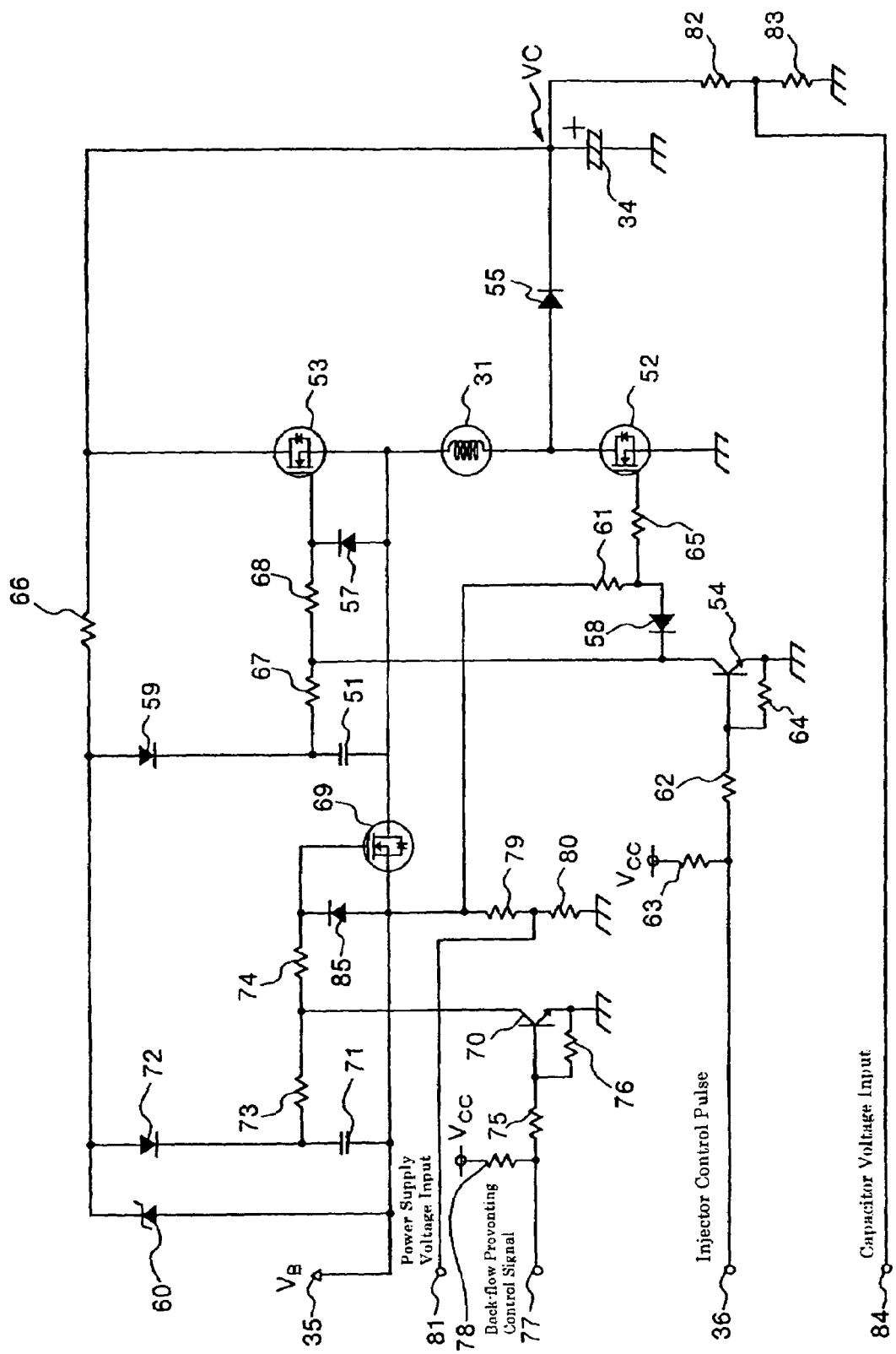
FIG. 5 is a circuit diagram which shows one example of the construction of a solenoid driving device constituting a third embodiment of the present invention.

FIG. 5 is a circuit diagram which shows one example of the construction of a solenoid driving device constituting a third embodiment of the of the present invention. The solenoid driving device of the third embodiment is devised so that the on/off control of the third N-channel FET 69 in the second embodiment shown in FIG. 4 is performed on the basis of control signals (hereafter referred to as "back-flow preventing control signals") that are input from the outside (i.e., externally supplied). Furthermore, construction components that are the same as those in the second embodiment are labeled with the same symbols as in the second embodiment, and a description of these construction components is omitted. Only those construction components that are different from the second embodiment are described below.

In the second embodiment, the base terminal of the second npn transistor 70 was connected to the positive pole terminal of the first capacitor 34 via the eleventh resistor 75. However, in the third embodiment, this base terminal is connected to the terminal into which back-flow preventing control signals are input (the back-flow preventing control signal input terminal) 77 via the resistor 75. The back-flow preventing control signal input terminal 77 is pulled up to the power supply voltage $V_{cc}$ by a thirteenth resistor 78. Furthermore, in the third embodiment, the emitter terminal of the second npn transistor 70 is grounded.

Furthermore, a fourteenth resistor 79 and a fifteenth resistor 80 are connected in series between the power supply terminal 35 and the ground. A terminal (power supply voltage input terminal) 81 which is used to output the power supply voltage to an external control device or the like is connected to the voltage dividing point. Furthermore, a sixteenth resistor 82 and a seventeenth resistor 83 are connected in series between the positive pole terminal of the first capacitor 34 and the ground, and a terminal (capacitor voltage input terminal) 84 that is used to output the voltage VC of the first capacitor 34 to an external control device or the like is connected to the voltage dividing point. Furthermore, the anode terminal of a sixth diode 85 is connected to the source terminal of the third N-channel FET 69, and the cathode terminal of this sixth diode 85 is connected to the gate terminal of the third N-channel FET 69.

Characteristic values of the respective elements will be shown as examples. The resistance value of the tenth resistor 74 is (for example) 2 kΩ. The resistance value of the eleventh resistor 75 is (for example) 4.7 kΩ. The resistance value of the twelfth resistor 76 is (for example) 47 kΩ. The resistance value of the thirteenth resistor 78 is (for example) 10 kΩ. The resistance values of the fourteenth resistor 79 and sixteenth resistor 82 are (for example) 19 kΩ. The resistance values of the fifteenth resistor 80 and seventeenth resistor 83 are (for example) 1 kΩ.

In the solenoid driving device constructed as shown in FIG. 5, the second npn transistor 70 is switched to an "on" state and the third N-channel FET 69 is switched to an "off" state by an external control device or the like when the voltage VC of the first capacitor 34 is higher than the power supply voltage $V_B$ that is applied to the power supply terminal 35. As a result, the current that abruptly flows to the solenoid 31 from the first capacitor 34 is prevented from flowing back toward the power supply terminal 35. When the voltage VC of the first capacitor 34 falls below the power supply voltage $V_B$, the second npn transistor 70 is switched to an "off" state, and the third N-channel FET 69 is switched to an "on" state, so that a current flows to the solenoid 31 from the power supply terminal 35. The second npn transistor 70 is also switched to an "off" state and the third N-channel FET 69 is switched to an "on" state when the driving of the solenoid 31 is stopped in order to stop the injection of fuel, so that a current flows to the solenoid 31 from the power supply terminal 35.

In the above-mentioned third embodiment, in addition to an effect which makes it possible to simplify the circuit and reduce the size of the circuit as a result of the lack of any need for a DC—DC converter circuit, and an effect which makes it possible to use N-channel FETs 53 and 69, the third N-channel FET 69 is also in an "on" state while the first capacitor 34 is being charged. Accordingly, an effect which makes it possible to suppress the generation of heat in the current back-flow preventing circuit to an even greater extent than in second embodiment is obtained.

Fourth Embodiment

Figure 6:
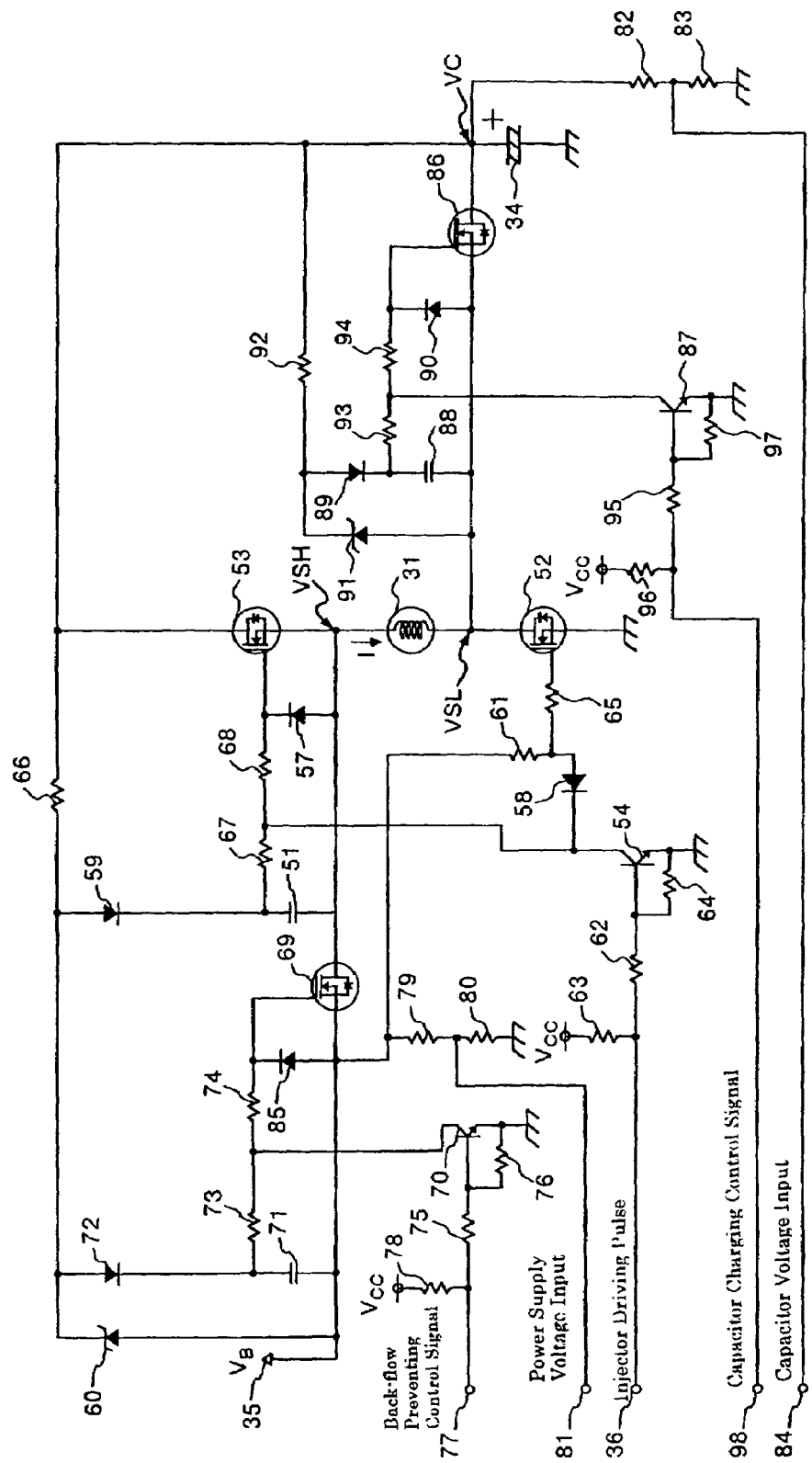
FIG. 6 is a circuit diagram which shows one example of the construction of a solenoid driving device constituting a fourth embodiment of the present invention.

FIG. 6 is a circuit diagram which shows one example of the construction of a solenoid driving device constituting a fourth embodiment of the present invention. The solenoid driving device of the fourth embodiment differs from the third embodiment shown in FIG. 5 in that a switching element is installed instead of the first diode 55 that constitutes the rectifying element in the third embodiment. There are no particular restrictions on this switching element; for example, however, this switching element is constructed from an N-channel FET (hereafter referred to as the "fourth N-channel FET") 86, and the on/off switching of this switching element is controlled by control signals (hereafter referred to as "capacitor charging control signals") that are input from the outside (i.e., externally supplied). Furthermore, in the fourth embodiment, an npn transistor (hereafter referred to as the "third npn transistor") 87, a fourth capacitor 88, seventh and eighth diodes 89 and 90, a second Zener diode 91 and eighteenth through twenty-third resistors 92, 93, 94, 95, 96 and 97 are installed as a switching element control circuit that is used to control the on/off switching of the fourth N-channel FET 86. The remaining construction of the fourth embodiment is the same as that of the third embodiment. Accordingly, the same symbols as those used in the third embodiment are assigned, and a description thereof is omitted.

The source terminal of the fourth N-channel FET 86 is connected to the connecting node of the solenoid 31 and the first N-channel FET 52. The drain terminal of the fourth N-channel FET 86 is connected to the positive pole terminal of the first capacitor 34. The anode terminal of the second Zener diode 91 is connected to the source terminal of the fourth N-channel FET 86, and the cathode terminal of the second Zener diode 91 is connected to the drain terminal of the fourth N-channel FET 86 via the eighteenth resistor 92. The anode terminal of the seventh diode 89 is connected to the connecting node of the cathode terminal of the second Zener diode 91 and the eighteenth resistor 92. The cathode terminal of the seventh diode 89 is connected to the anode terminal of the second Zener diode 91 via the fourth capacitor 88. The seventh diode 89, fourth capacitor 88, second Zener diode 91 and eighteenth resistor 92 hold the peak voltage that is generated by the charging of the first capacitor 34 in order to drive the switching element control circuit.

The connecting node of the seventh diode 89 and the fourth capacitor 88 is connected to the nineteenth resistor 93, and this nineteenth resistor 93 is connected to the base terminal of the fourth N-channel FET 86 via the twentieth resistor 94. The collector terminal of the third npn transistor 87 is connected to the connecting node of the nineteenth resistor 93 and the twentieth resistor 94. The emitter terminal of the third npn transistor 87 is grounded. The base terminal of the third npn transistor 87 is connected via the twenty-first resistor 95 to the terminal (capacitor charging control signal input terminal) 98 into which capacitor charging control signals are input. The capacitor charging control signal input terminal 98 is pulled up to the power supply voltage Vcc by the twenty-second resistor 96. The twenty-third resistor 97 is connected between the base terminal and the emitter terminal of the third npn transistor 87. Furthermore, the anode terminal of the eighth diode 90 is connected to the source terminal of the fourth N-channel FET 86, and the cathode terminal of the eighth diode 90 is connected to the gate terminal of the fourth N-channel FET 86.

Characteristic values of the respective elements will be shown as examples. For example, the capacitance of the fourth capacitor 88 is 0.1 µF. The output voltage of the second Zener diode 91 is (for example) 9 V. The resistance values of the eighteenth, nineteenth and twenty-second resistors 92, 93 and 96 are (for example) 10 kΩ. The resistance value of the twentieth resistor 94 is (for example) 2 kΩ. The resistance value of the twenty-first resistor 95 is (for example) 4.7 kΩ. The resistance value of the twenty-third resistor 97 is (for example) 47 kΩ.

Figure 7:
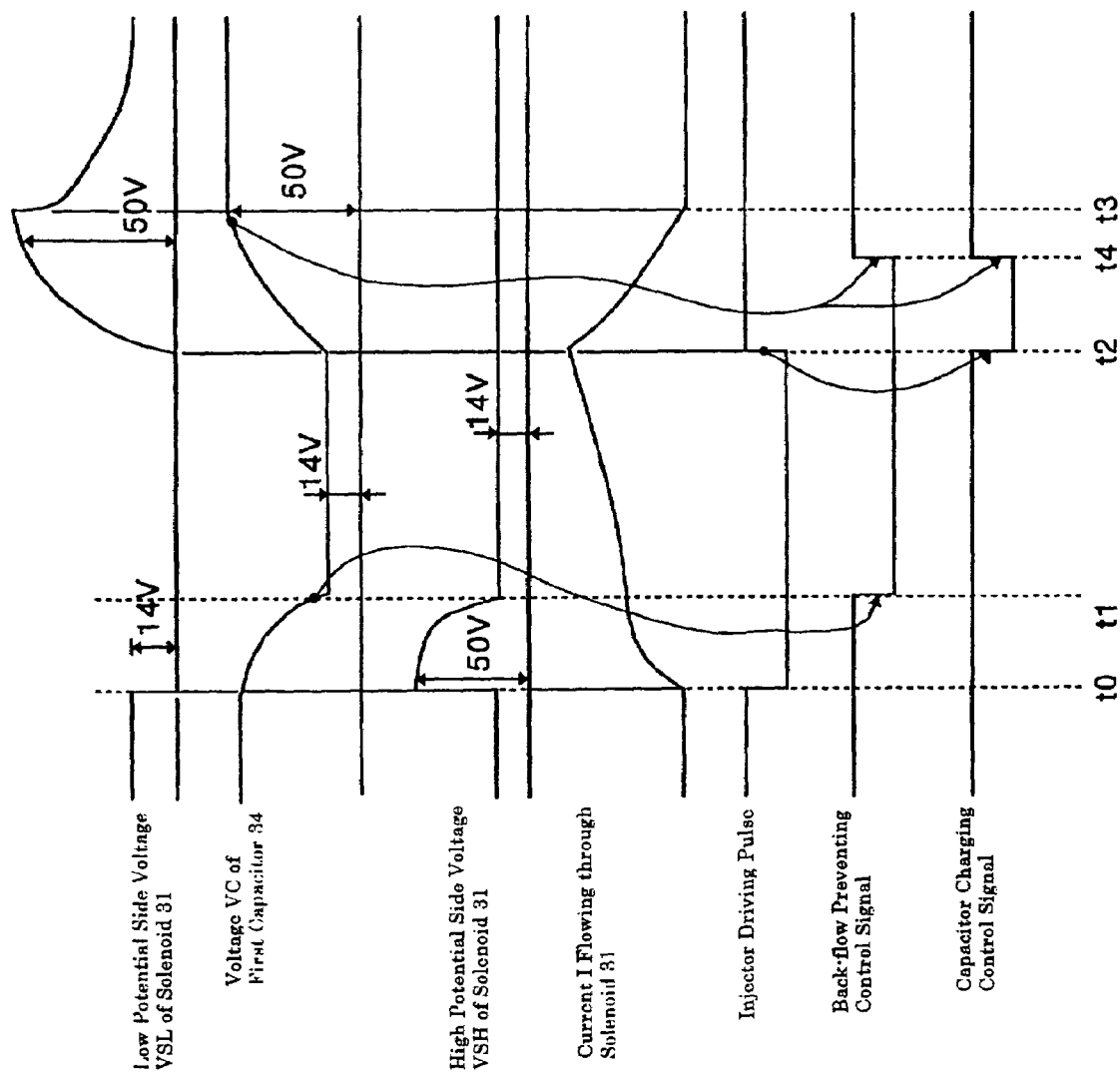
FIG. 7 is a waveform diagram which shows examples of the waveforms in various parts of the solenoid driving device constituting the fourth embodiment of the present invention.
Figure 8:
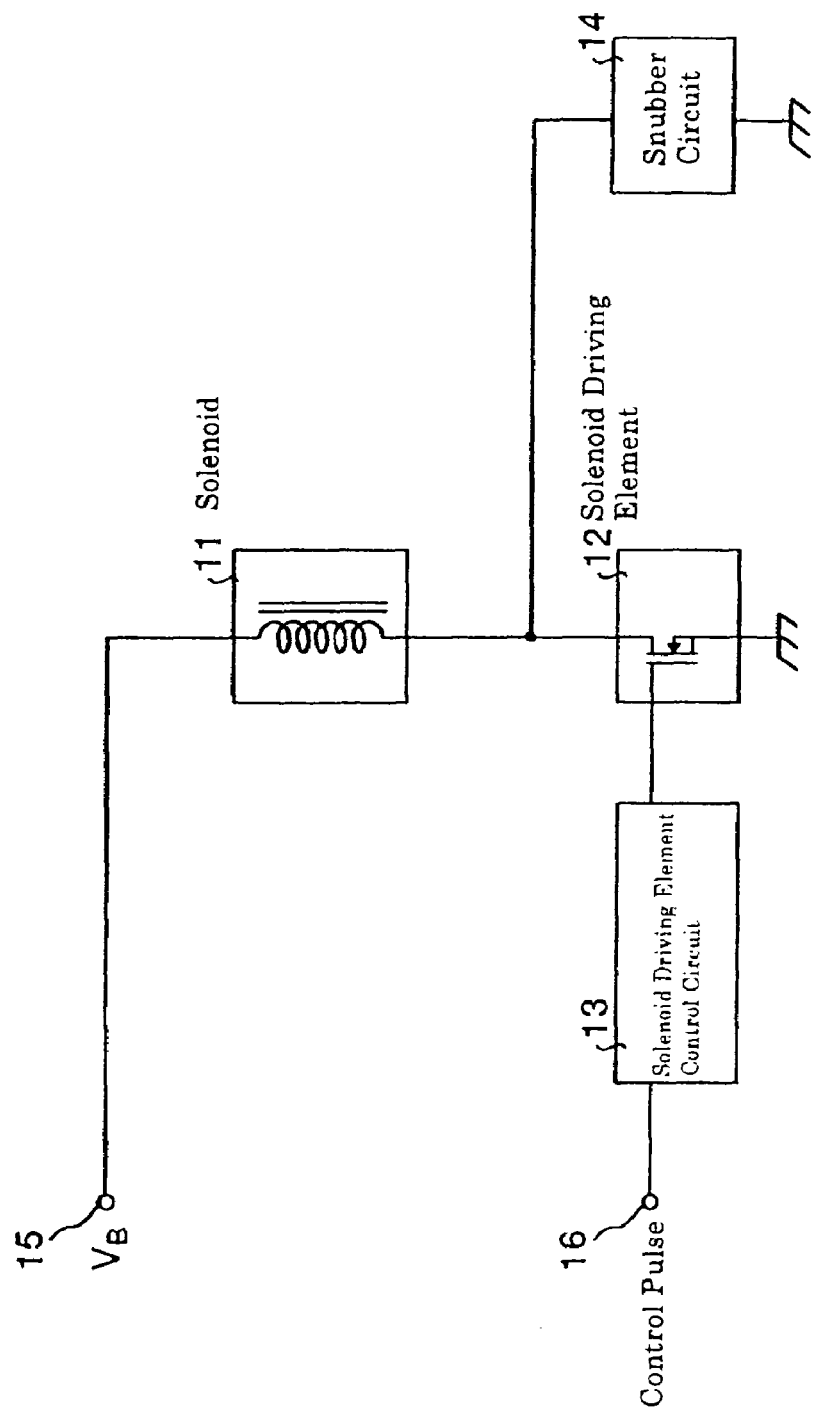
FIG. 8 is a block diagram which shows the construction of a common conventional solenoid driving device.
Figure 9:
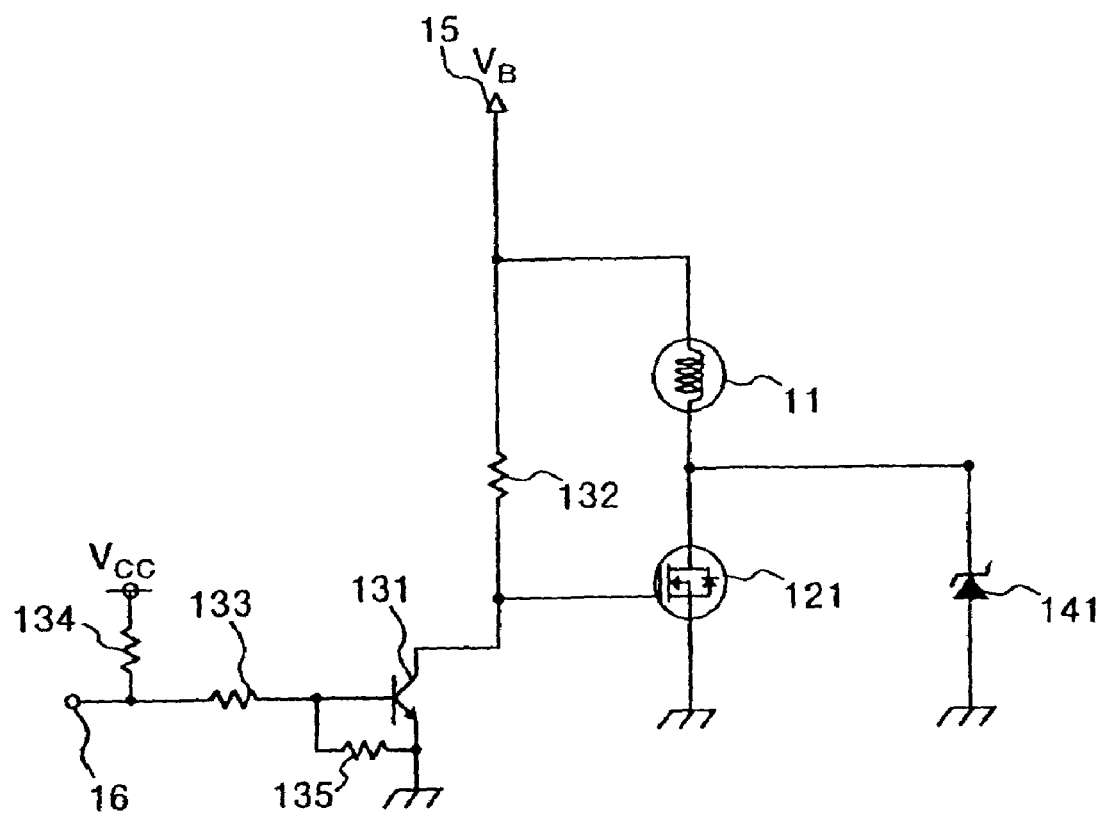
FIG. 9 is a circuit diagram which shows the concrete construction of the solenoid driving device shown in FIG. 8.
Figure 10:
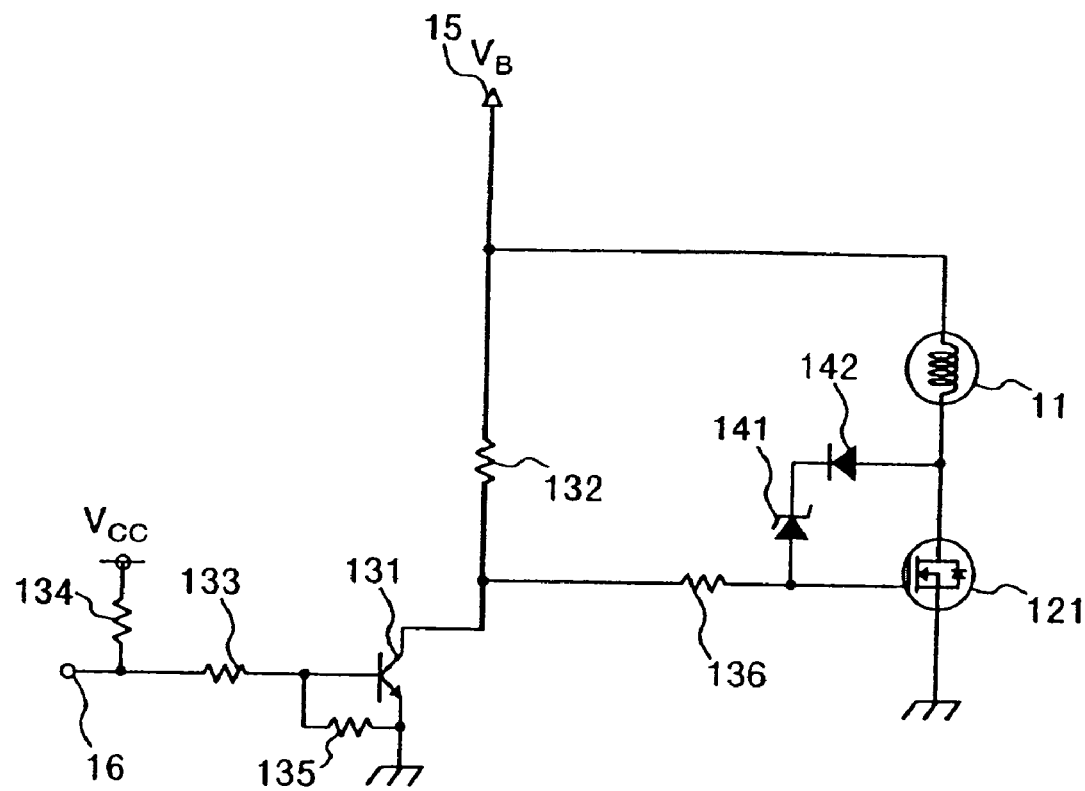
FIG. 10 is a circuit diagram which shows another example of the concrete construction of the solenoid driving device shown in FIG. 8.

FIG. 7 is a diagram which shows the respective waveforms of the voltage VSL on the low-potential side of the solenoid 31, the voltage VC of the first capacitor 34, the voltage VSH on the high-potential side of the solenoid 31, the current I that flows through the solenoid 31, and the injector driving pulse, back-flow preventing control signal and capacitor charging control signal that are input via the control signal input terminal 36. In the solenoid driving device constructed as shown in FIG. 6, the back-flow preventing control signal is set at the H level and the second npn transistor 70 is switched to an "on" state by an external control device or the like when the voltage VC of the first capacitor 34 is higher than the power supply voltage $V_B$ that is applied to the power supply terminal 35. As a result, the third N-channel FET 69 is switched to an "off" state, so that the current that abruptly flows to the solenoid 31 from the first capacitor 34 is prevented from flowing back toward the power supply terminal 35.

When the voltage VC of the first capacitor 34 is lower than the power supply voltage $V_B$, the back-flow preventing control signal is set at the L level, so that the second npn transistor 70 is switched to an "off" state. As a result, the third N-channel FET 69 is switched to an "on" state, so that a current flows to the solenoid 31 form the power supply terminal 35. At the point in time at which the injector driving pulse is switched from the L level to the H level in order to stop the injection of fuel, the capacitor charging control signal is switched from the H level to the L level, so that the third npn transistor 87 that was in an "on" state is switched to an "off" state. As a result, the fourth N-channel FET 86 is switched from an "off" state to an "on" state, so that a current flows to the first capacitor 34. During the charging period of the first capacitor 34, the back-flow preventing control signal is maintained at the L level, and the third N-channel FET 69 is switched to an "on" state, so that a current flows to the solenoid 31 form the power supply terminal 35. At the point in time at which the charging of the first capacitor 34 is more or less completed, the back-flow preventing control signal and capacitor charging control signal are returned to the H level, and the third and fourth N-channel FETs 69 and 86 are switched to an "off" state.

In the above-mentioned fourth embodiment, an effect which makes it possible to simplify the circuit and reduce the size of the circuit is obtained as a result of the lack of any need for a DC—DC converter circuit. Furthermore, an effect which makes it possible to use N-channel FETs 53 and 69, and an effect which makes it possible to suppress the generation of heat in the current back-flow preventing circuit, are also obtained. Moreover, since the rectifying element is constructed from a switching element consisting of the fourth N-channel FET 86, an effect which makes it possible to suppress the generation of heat in this circuit is also obtained. Furthermore, a high-performance N-channel FET (fourth N-channel FET 86) which is less expensive than a P-channel FET can be used as the switching element.

Furthermore, in the above-mentioned first through fourth embodiments, the coil current of the solenoid 31 is abruptly increased by utilizing the energy stored in the first capacitor 34. Accordingly, an effect that allows high-speed driving and that results in a reduced current consumption can be obtained. Since the current consumption is reduced, the generation of heat by the solenoid 31 can be suppressed. When the rise of the coil current is accelerated, the dynamic range as the ratio of the time for which fuel is actually injected relative to the injector driving pulse width is broadened, so that the control of fuel injection is facilitated. Furthermore, since the current back-flow preventing circuit is constructed from an FET, the voltage drop in the current back-flow preventing circuit is approximately 0.1 V, which is smaller than the voltage drop (0.7 to 1.0 V) in cases where a diode is used. Accordingly, the driving voltage of the solenoid 31 is substantially increased, so that an effect that improves the fuel injection performance is obtained.

The present invention is not limited to the above-mentioned embodiments. Various alterations are possible. For example, the switching elements that constitute the current back-flow preventing circuit and the rectifying element are not limited to N-channel FETs; P-channel FETs may also be used. Furthermore, npn or pnp bipolar transistors may also be used. Moreover, the solenoid driving element and discharge control element are likewise not limited to N-channel FETs; P-channel FETs may also be used, or npn or pnp bipolar transistors may be used. Furthermore, the present invention can of course be used in injectors of the conventional type in which fuel that is pressurized and fed by a fuel pump or regulator is injected, and the present invention may also be used in injector devices of a new type in which the injector also acts as a fuel pump and injects the fuel while pressurizing this fuel. In systems in which the injector also acts as a fuel pump, the abovementioned dynamic range tends to be smaller than in injectors of the conventional type; accordingly, the present invention is especially effective in such systems.

In the present invention, the discharge control circuit is driven by a high voltage that is generated in a capacitor. Accordingly, there is no need for a DC—DC converter circuit, and as a result, the circuit can be simplified and reduced in size. Furthermore, in the present invention, the voltage drop that occurs in the current back-flow preventing circuit when current flows from the power supply terminal to the solenoid is reduced, so that the generation of heat in this circuit is suppressed. Moreover, in the present invention, the voltage drop that occurs in the rectifying element when current flows from the solenoid to the capacitor is reduced, so that the generation of heat in this element is suppressed.

The invention claimed is:

1. A solenoid driving device for fuel injection comprising:
a solenoid for fuel injection;
a solenoid driving element for driving said solenoid;
a capacitor for temporarily storing electric power accumulated in said solenoid when the driving of said solenoid is stopped,
a peak voltage holding circuit for storing a peak voltage of the accumulated power in said capacitor:
a discharge control element for providing the accumulated power in said capacitor to said solenoid when said solenoid driving element is driven; and
a discharge control circuit for providing the peak voltage of said capacitor to said discharge control element when said discharge control element is driven.

2. The solenoid driving device according to claim 1, wherein said discharge control element is a field effect transistor.

3. A solenoid driving device according to claim 1, further comprising a current back-flow preventing circuit for preventing a current flow of the accumulated power in said capacitor into a power supply battery when said discharge control element is driven.

4. The solenoid driving device according to claim 3, wherein said current back-flow preventing circuit comprises a switching element for providing battery power to said solenoid only when the capacitor voltage is lower than the battery voltage.

5. The solenoid driving device according to claim 4, wherein said switching element is a field effect transistor.

* * * * *